United States Patent [19]
Inoue et al.

[11] Patent Number: 5,283,455
[45] Date of Patent: Feb. 1, 1994

[54] THIN FILM FIELD EFFECT ELEMENT HAVING AN LDD STRUCTURE

[75] Inventors: Yasuo Inoue; Tadashi Nishimura; Motoi Ashida, all of Hyogo, Japan

[73] Assignee: Mitsubishi Denki Kabushiki Kaisha, Tokyo, Japan

[21] Appl. No.: 911,582

[22] Filed: Jul. 10, 1992

[30] Foreign Application Priority Data

Aug. 9, 1991 [JP] Japan ................. 3-199717

[51] Int. Cl.$^5$ ............... H01L 29/76; H01L 29/94; H01L 27/01; H01L 31/062
[52] U.S. Cl. .................. 257/329; 257/344; 257/347; 257/408
[58] Field of Search ........... 257/66, 67, 69, 57, 257/329, 336, 344, 347, 348, 349, 352, 353, 408, 903, 904, 900

[56] References Cited

U.S. PATENT DOCUMENTS

| | | | |
|---|---|---|---|
| 4,502,202 | 3/1985 | Malhi ................. | 257/369 |
| 4,554,572 | 11/1985 | Chatterjee ............ | 257/377 |
| 4,555,721 | 11/1985 | Bansal et al. .......... | 257/369 |
| 4,980,732 | 12/1990 | Okazawa ............... | 257/903 |
| 5,001,540 | 3/1991 | Ishihara ............... | 257/329 |
| 5,173,754 | 12/1992 | Manning ............... | 257/903 |

FOREIGN PATENT DOCUMENTS

| | | | |
|---|---|---|---|
| 63-237559 | 10/1988 | Japan ................. | 257/369 |
| 63-260162 | 10/1988 | Japan ................. | 257/408 |
| 2-237149 | 9/1990 | Japan ................. | 257/347 |
| 3-69168 | 3/1991 | Japan ................. | 257/66 |

OTHER PUBLICATIONS

"Drain-Engineered Hot-Electron-Resistant Device Structures: A Review", J. Sanchez et al, IEEE Transactions of Electron Devices, vol. 36, No. 6, Jun. 1989, pp. 1125-1131.
"1/4 μmLATID (LArge-Tilt-angle Implanted Drain) Technology for 3.3-V Operation", T. Hori, IEDM 89-777-780, 1989.
1984 Symposium on VLSI Technology, Sep. 10-12, 1984, pp. 8-9, Shah et al., "A 2 μm Stacked CMOS 64K SRAM".

*Primary Examiner*—William Mintel
*Assistant Examiner*—Steven Loke
*Attorney, Agent, or Firm*—Lowe, Price, LeBlanc & Becker

[57] ABSTRACT

An upper insulating layer is formed on an upper surface of a gate electrode formed on an insulating substrate. A gate insulating layer is formed on sidewalls of the gate electrode and the surfaces of the upper insulating layer. A semiconductor layer is formed on the surfaces of the gate insulating layer. Three source/drain regions are formed in the semiconductor layer. Two independent channel regions are formed in the semiconductor layer along both side surfaces of the gate electrode. Source/drain regions are arranged on both ends of two channel regions. Each source/drain region has an LDD structure formed in a self alignment manner by an oblique ion implantation method and a vertical ion implantation method using sidewall insulating layers formed on the channel regions as masks.

5 Claims, 9 Drawing Sheets

THIN FILM FIELD EFFECT ELEMENT HAVING AN LDD STRUCTURE

BACKGROUND OF THE INVENTION

1. Field of the Invention

The present invention relates to a structure in which electric field through a thin film field effect transistor using a polycrystalline silicon layer of a thin film as a channel layer can be decreased and to a manufacturing method of the thin film field effect transistor.

2. Description of the Background Art

A so-called thin film transistor (TFT) is one of types of insulated field effect transistors structured to have semiconductor thin films formed on insulating substrates and channel regions within the thin films.

FIG. 7 is a sectional structural view of a conventional thin film transistor. In the conventional thin film transistor, a gate electrode 5 of a polycrystalline silicon layer is formed on a surface of an insulating substrate or insulating layer 1. A gate insulating layer 7 of an oxide film or the like is formed on the surfaces of insulating substrate 1 and gate electrode 5. A semiconductor layer 8 of polycrystalline silicon or single crystalline silicon is formed on a surface of gate insulating layer 7. A pair of source/drain regions 14, 14 are formed in the semiconductor layer 8, and a channel region 12 is formed between these source/drain regions 14, 14. The surface of semiconductor layer 8 is covered with an interlayer insulating layer 15. Interconnection layers 16 are connected to source/drain regions 14, 14, respectively, through contact holes formed in interlayer insulating layer 15. Such a type of a gate electrode 5 being formed under channel region 12 is called a bottom gate type thin film transistor. FIG. 16 (a) is an equivalent circuit diagram of the bottom gate thin film transistor.

Manufacturing steps of the thin film transistor shown in FIG. 7 will be described. FIGS. 8 through 13 are sectional structural views sequentially showing respective manufacturing steps of the thin film transistor (a first step through a sixth step).

First, as shown in FIG. 8, a polycrystal silicon layer 2 is formed on the surface of insulating layer substrate 1 using a CVD (Chemical Vapor Deposition) method. A resist pattern 4 is formed on the surface of polycrystalline silicon layer 2 using a photolithography method and an etching method. Then, using a resist pattern 4 as a mask, polycrystalline silicon layer 2 is etched and a gate electrode 5 is formed.

Next, as shown in FIG. 9, a gate insulating film 7 and a semiconductor layer 8 of polycrystalline silicon or single crystalline silicon are formed on the whole wafer. A resist pattern 24 to define shapes of active regions is then formed on the surface of semiconductor layer 8 using a photolithography method. Using the resist pattern 24 as a mask, semiconductor layer 8 is patterned. After the resist pattern 24 is removed, impurities of a first type conductivity are ion-implanted into semiconductor layer 8 in a dose of $0-5\times10^{13}/cm^2$.

As shown in FIG. 10, a resist pattern 25 is formed on the surface of a region which is to be a channel region of semiconductor layer 8 using a photolithography method. Using resist pattern 25 as a mask, impurity ions 33 of a second type conductivity are ion-implanted into semiconductor layer 8 in a dose of $5\times10^{14}-1\times10^{16}/cm^2$, so that a pair of source/drain regions 14, 14 are formed in semiconductor layer 8.

As shown in FIG. 11, an interlayer insulating film 15 is formed on the whole surface. On the surface of interlayer insulating layer 15, resist pattern 26 is formed for forming contact holes. Using resist pattern 26 as a mask, interlayer insulating layer 15 is etched to form contact holes reaching source/drain regions 14, 14.

As shown in FIG. 12, after resist pattern 26 is removed, interconnection layers 16 are formed within contact holes and on the surface of interlayer insulating layer 15 and is patterned to a prescribed interconnection pattern. By following the above steps, wafer process of a thin film transistor shown in FIG. 12 (corresponding to FIG. 7) is finished.

A bottom gate type thin film transistor manufactured by the above stated method has source/drain regions formed by ion implantation using resist 25 as a mask, as shown in FIG. 10. A problem sometimes arises that gate electrode 5 and resist pattern 25 for forming source/drain regions are not in register because of alignment errors of a mask for forming a resist pattern. FIG. 13 is a sectional structural view showing positions of resist pattern 25 and source/drain regions 14, 14 when an alignment error occurs. When such an alignment error shown in the figure occurs, one of source/drain regions 14 is separated from gate electrode 5 and a so-called offset structure is formed. When such a thin film transistor of an offset structure is formed, a problem arises that transistor characteristics deteriorate. In particular, as a device is miniaturized and a channel length becomes 1 $\mu m$ or shorter than 1 $\mu m$, the problem of an alignment error of a mask has been more significant than ever.

In order to avoid the alignment error of a mask, a thin film transistor formed by a method in which an alignment of gate electrode with source/drain regions is carried out using a self-alignment technology has been conceived. FIG. 14 is a sectional structural view of a bottom gate type thin film transistor having source/drain regions formed by the self-alignment technology. The thin film transistor shown is described, for example, in Symposium on VLSI Technology p.8, Sep. 10-12, 1984. FIG. 16 (b) is an equivalent circuit diagram of the thin film transistor shown in FIG. 14. As shown in FIGS. 14 and 16 (b), the thin film transistor includes a pair of source/drain regions 14, 14 formed in semiconductor layer 8 located on the surface of insulating substrate 1 and a source/drain region 14 formed in semiconductor layer 8 located above gate electrode 5. Channel regions 12, 12 are formed in semiconductor layer 8 located on the sidewalls of gate electrode 2. Hence, this thin film transistor has two transistors formed on the sidewalls of the gate and connected in series.

A method of manufacturing a thin film transistor shown in FIG. 14 will be described. Manufacturing step of a first conventional example shown in FIGS. 8 and 9 can be also used in manufacturing steps of the film transistor shown in FIG. 14. Therefore, the description of the steps shown in FIGS. 8 and 9 will not be repeated. Following the steps shown in FIG. 9, as shown in FIG. 15, impurity ions 34 are ion-implanted vertically into semiconductor layer 8. By this ion implantation, semiconductor layer 8 has impurities implanted only in a region extending on the surface of insulating substrate 1 and a region above gate electrode 2 to form source/drain regions 14, 14, but not in a region on the sidewalls of gate electrode 2 which are to be channel regions 12, 12.

Thereafter interlayer insulating layer 15 and interconnection layer 16 are formed as in the first conventional example.

However, in the conventional bottom gate type thin film transistor shown in FIG. 14, a problem exists that large electric field strength is generated in a region of semiconductor layer 8 where a source/drain region 14 is superimposed on gate electrode 2 resulting in an increase in leakage current. Since channel regions 12, 12 are formed on the sidewalls of gate electrode 2, a channel length is short and therefore a problem of a decrease in a breakdown voltage between source/drain regions 14, 14 arises.

SUMMARY OF THE INVENTION

One object of the present invention is to provide a thin film transistor which is a type of bottom gate type thin film transistor having source/drain regions formed by a self-alignment technology and which has an LDD structure in which electric field generated in the vicinity of drains can be reduced.

Another object of the present invention is to provide a manufacturing method of a bottom gate type thin film transistor provided with a source/drain having an LDD structure.

In one aspect of the present invention, a thin film field effect element has a gate electrode formed on a surface of an insulating base layer, an insulating layer formed on a surface of the gate electrode and a surface of the base layer, and a semiconductor layer formed on the surface of the insulating layer. Channel regions are formed in the semiconductor layer located on side surfaces of the gate electrode. Impurity regions of low concentration adjacent to the channel regions and impurity regions of high concentration adjacent to the impurity region of low concentration are formed in the semiconductor layer.

In the thin film field effect element, with impurity regions of a low concentration on both sides of channel regions, source/drain regions are formed to have a so-called LDD (Light Doped Drain) structure, so that electric field, particularly, in the vicinity of a drain region is reduced and leakage current is reduced.

In a second aspect of the present invention, a manufacturing method of a thin film field effect element includes the following steps. A semiconductor layer and a first insulating layer on a surface of insulating base layer are formed and patterned to form a gate electrode layer and a first insulating layer on an upper surface of the gate electrode layer. A second insulating layer is formed on a surface of the gate electrode layer and a surface of the first insulating layer. The semiconductor layer is formed on a surface of the second insulating layer. Sidewall insulating layers are formed on sidewalls of the semiconductor layer, Impurity regions of low concentration extending in the semiconductor layer located under the sidewall insulating layers are formed by ion-implanting impurity ions into the semiconductor layer obliquely with respect to the surface of the base layer using the sidewall insulating layers as masks. Impurity regions of high concentration adjacent to the impurity region of low concentration are formed in the semiconductor layer by ion-implanting impurity ions almost vertically with respect to the surface of the base layer using sidewall insulating layers as masks.

In the manufacturing method of a thin film field effect element, sidewall insulating layers are formed on side surfaces of the semiconductor layer on sidewalls of the gate electrode, and source/drain regions of an LDD structure each having a region of low concentration and a region of high concentration are formed in a self-alignment method employing an oblique ion implantation method and a vertical ion implantation method using the sidewall insulating layers as masks.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
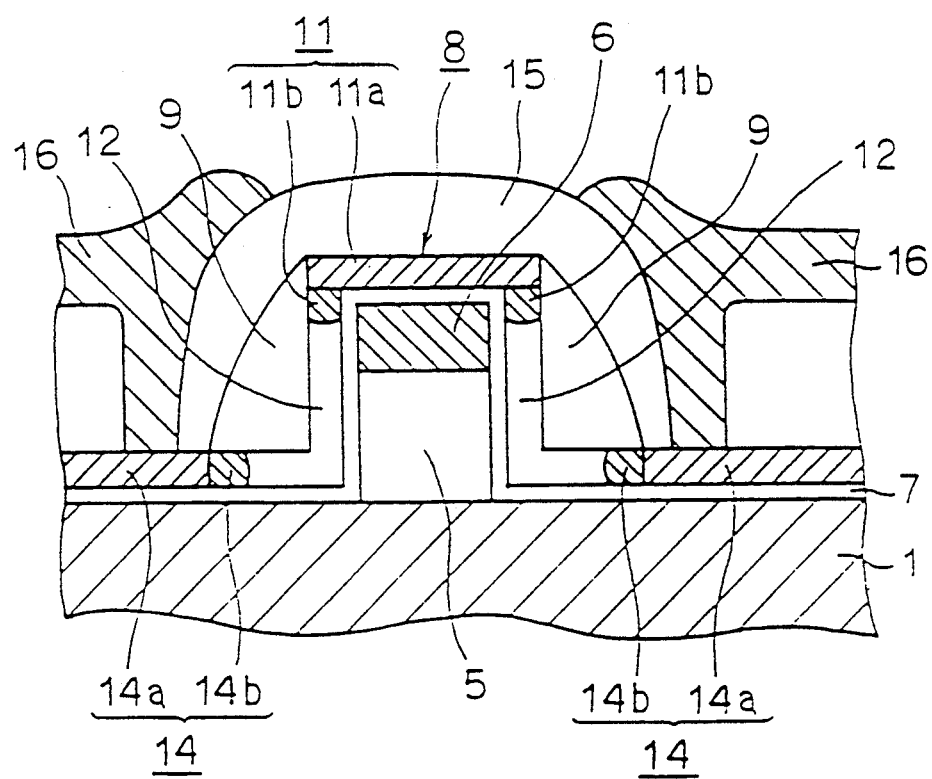
FIG. 1 is a sectional structural view of a thin film transistor according to an embodiment of the present invention.

Referring to FIG. 1, a gate electrode 5 of polycrystalline silicon is formed on a surface of an insulating substrate or interlayer insulating film 1 (hereinafter referred to as insulating substrate 1). An upper insulating layer 6 having the same shape as that of the gate electrode 5 is formed on the upper surface of the gate electrode 5. A gate insulating film 7 of silicon oxide is formed on the sidewalls of the gate electrode 5, the surface of the upper insulating layer 6, the surface of the insulating substrate 1. A semiconductor layer 8 of polycrystalline silicon or single crystalline silicon is formed on the surface of gate insulating film 7. Three source/drain regions 11, 14, 14 are formed in the semiconductor layer 8. Each source/drain region is formed to have a so-called LDD structure comprised of impurity regions of low concentration 11b, 14b and impurity regions of high concentration 11a, 14a. Source/drain region 11 is formed in a region of semiconductor layer 8 located above gate electrode 5, and two source/drain regions 14, 14 are formed in a region of semiconductor layer 8 located on the surface of insulating substrate 1. Channel regions 12, 12 are formed between source/drain region 14 and source/drain region 11, and between source/drain region 11 and the other source/drain region 14, respectively. Sidewall insulating layers 9, 9 are formed on the sidewalls of the steps of semiconductor layer 8. The upper layer of semiconductor layer 8 is covered with a thick interlayer insulating layer 15. Interconnection layers 16 are connected to source/drain regions 14, 14 through contact holes formed in interlayer insulating layer 15.

Since upper insulating film 6 is formed on the upper surface of gate electrode 5 in the thin film transistor, a thickness of insulating layer interposed between gate electrode 5 and source/drain region 11 is increased particularly at the upper corners of gate electrode 5. As a result, electric field generated in the corners of gate electrode 5 is reduced and gate insulation breakdown voltage increases.

By forming source/drain regions 11, 14 to have an LDD structure, electric field generated, in particular, in the vicinity of drain is decreased and leakage current is reduced.

Manufacturing step will be described.

Figure 2:
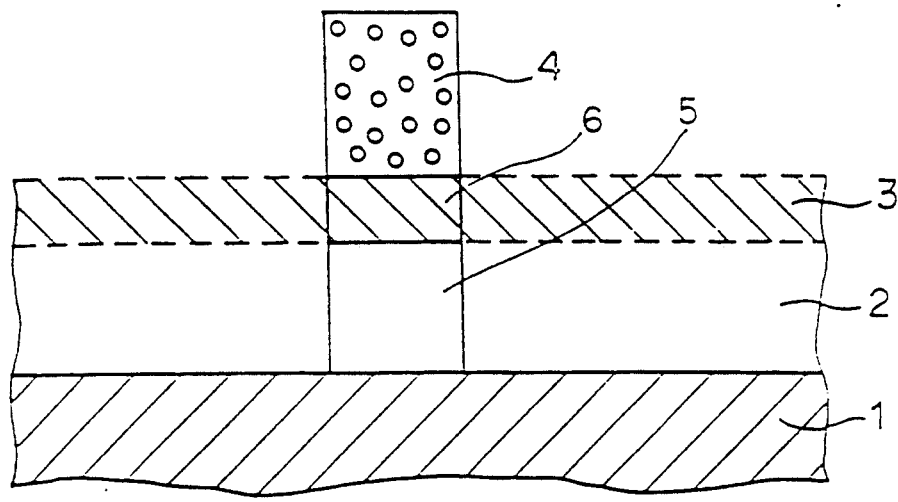
FIGS. 2 through 6 are sectional structural views successively showing respective steps of manufacturing the thin film transistor shown in FIG. 1.

First, as shown in FIG. 2, a polycrystalline silicon layer in a thickness of 500 nm is formed on the surface of insulating substrate 1 using a CVD method, and insulating film 3 having a thickness of 200 nm is formed on the surface of the polycrystalline silicon layer. Resist pattern 4 is formed on a surface of insulating layer 3 using a photolithography method. Using resist pattern 4 as a mask, insulating layer 3 and polycrystalline silicon layer 2 are patterned, so that gate electrode 5 and upper insulating film 6 are formed.

Figure 3:
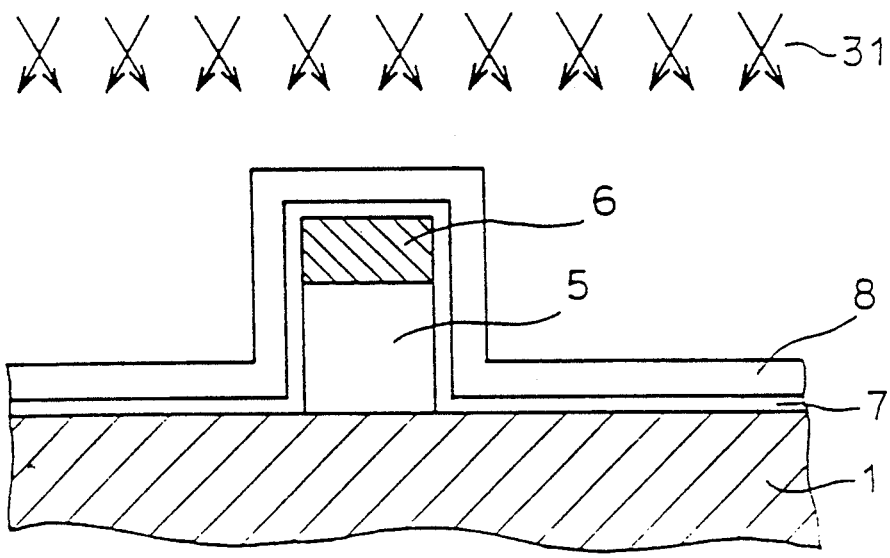

Referring to FIG. 3, gate insulating film 7 of, for example, silicon oxide film is formed on the whole surface. Polycrystalline silicon layer 8 in a thickness of not more than 100 nm is formed on the surface of gate insulating film 7 using, for example, a CVD method. Then, for example, boron ions 31 are implanted in a dose of about $1 \times 10^{12}/cm^2$ into polycrystalline silicon layer 8 using an oblique rotation ion implantation method, so that a threshold value of the channel regions is set to be a predetermined value.

Figure 4:
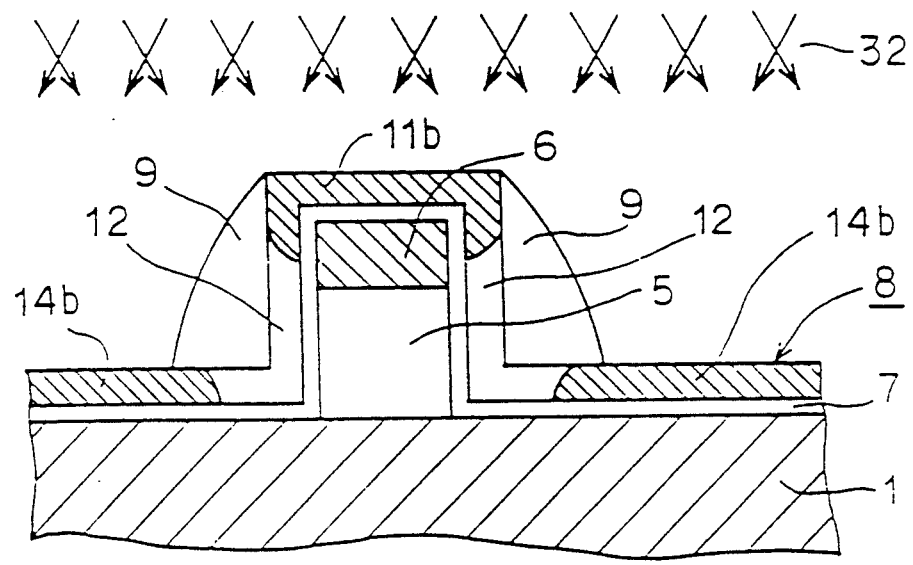

Referring to FIG. 4, a silicon oxide film is deposited in a thickness of about 200 nm on the whole surface using, for example, a CVD method. By anisotropically etching the silicon oxide film, sidewall insulating layers 9, 9 are formed on the side surface of the steps of polycrystalline silicon layer 8. Then again, phosphorus ions 32 are implanted into polycrystalline silicon layer 8 in a dose of $1 \times 10^{13}/cm^2$ using an oblique rotation ion implantation method. Impurity regions of low concentration 11b, 14b are formed in polycrystalline silicon layer 8 through the ion implantation step. Since phosphorus ions 32 are implanted obliquely with respect to the surface of polycrystalline silicon layer 8, impurity regions of low concentration 14b formed in polycrystalline silicon layer 8 on the surface of insulating substrate 1 extend under sidewall insulating layers 9.

Figure 5:
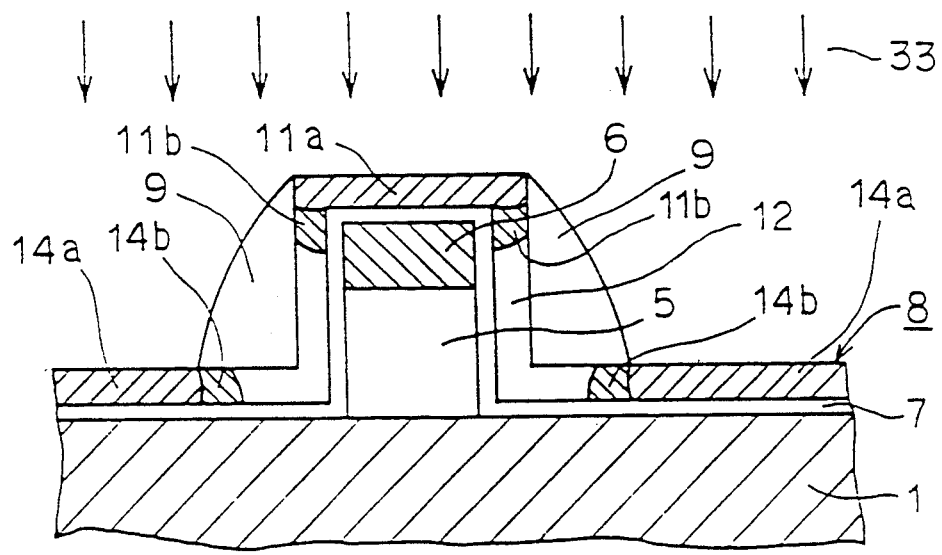

Referring to FIG. 5, arsenic ions or phosphorus ions 33 are implanted in a dose of $1 \times 10^{15}/cm^2$ (in the case of using arsenic) almost vertically with respect to the surface of polycrystalline silicon layer 8 to form impurity regions of high concentration 11a, 14a. By following the above mentioned steps, source/drain regions 11, 14 of an LDD structure having impurity regions of low concentration 11b, 14b and impurity regions of high concentration 11a, 14a are formed.

Figure 6:
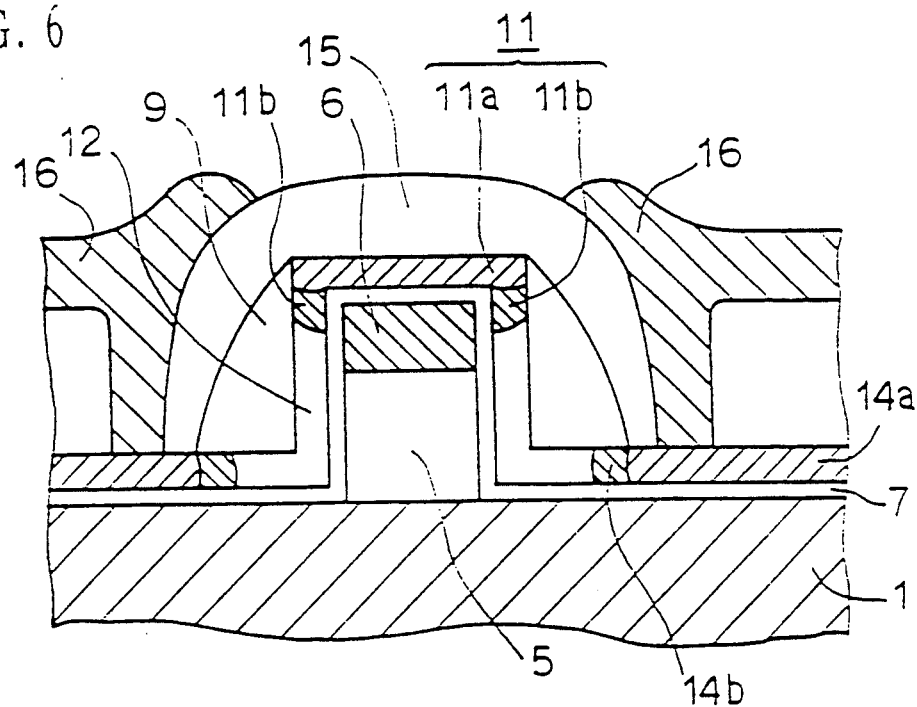
Figure 7:
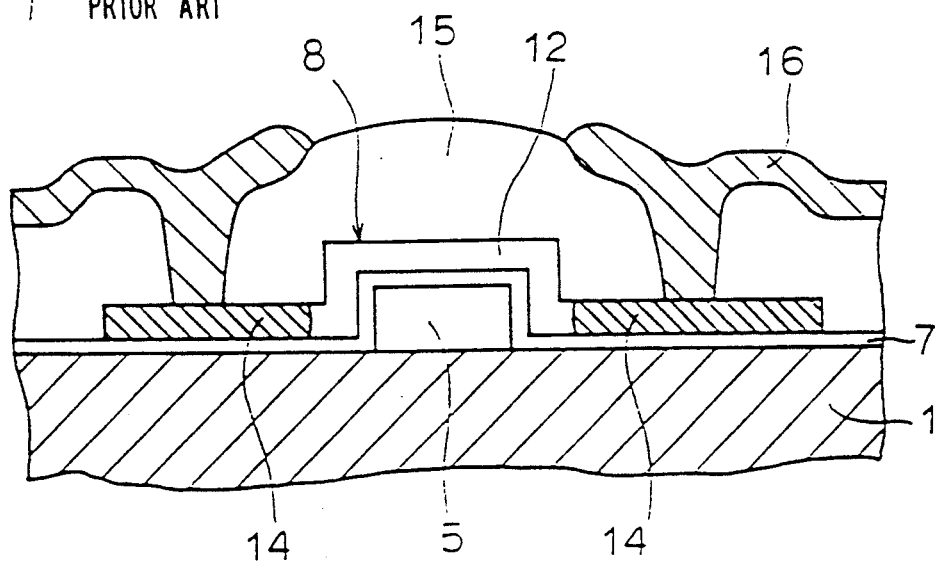
FIG. 7 is a sectional structural view of a thin film transistor according to a first conventional example.
Figure 8:
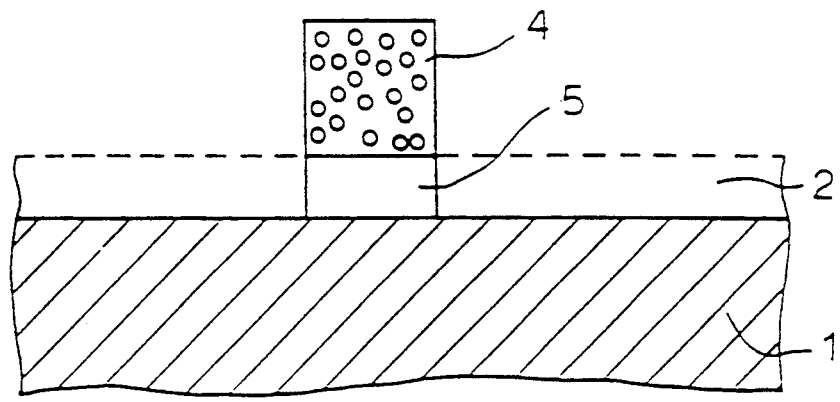
FIGS. 8 through 12 are sectional structural views successively showing respective steps of manufacturing the thin film transistor shown in FIG. 7.
Figure 9:
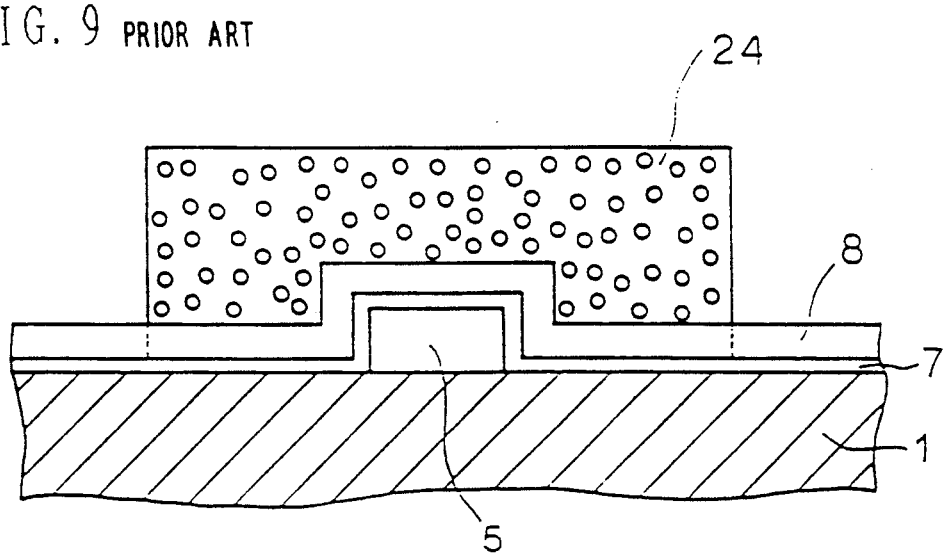
Figure 10:
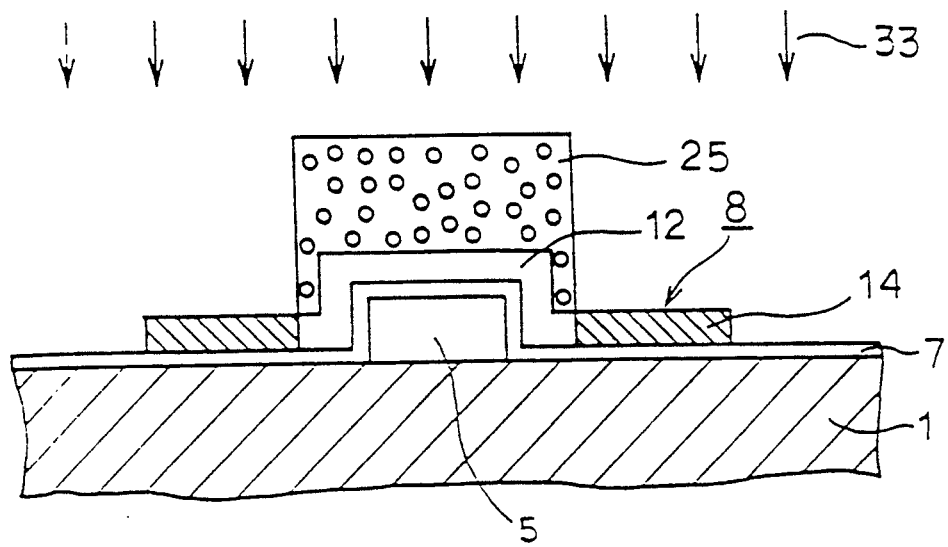
Figure 11:
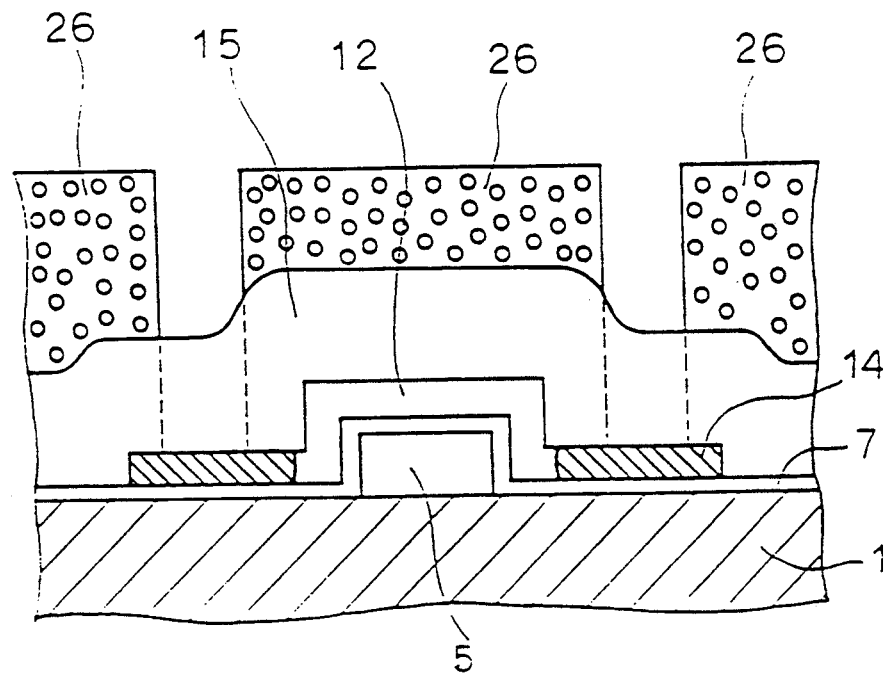
Figure 12:
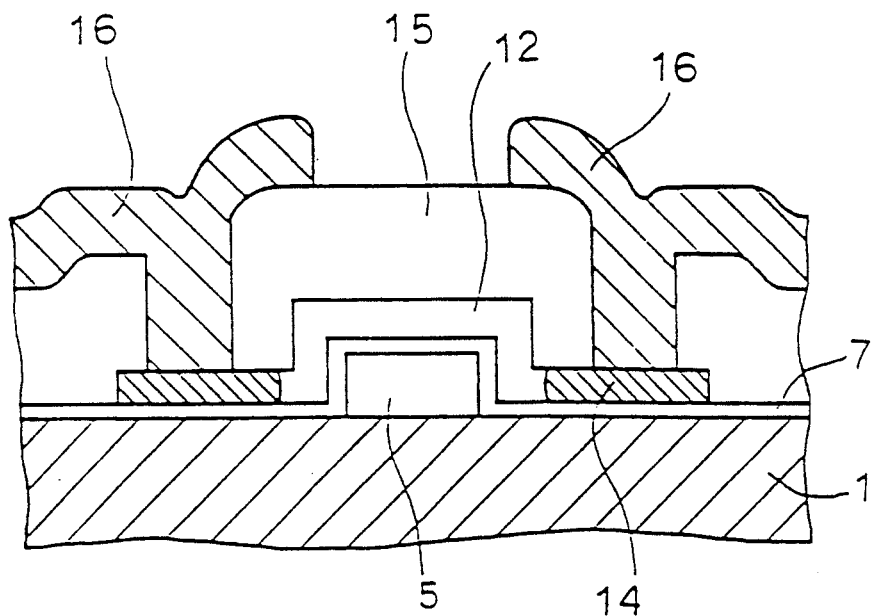
Figure 13:
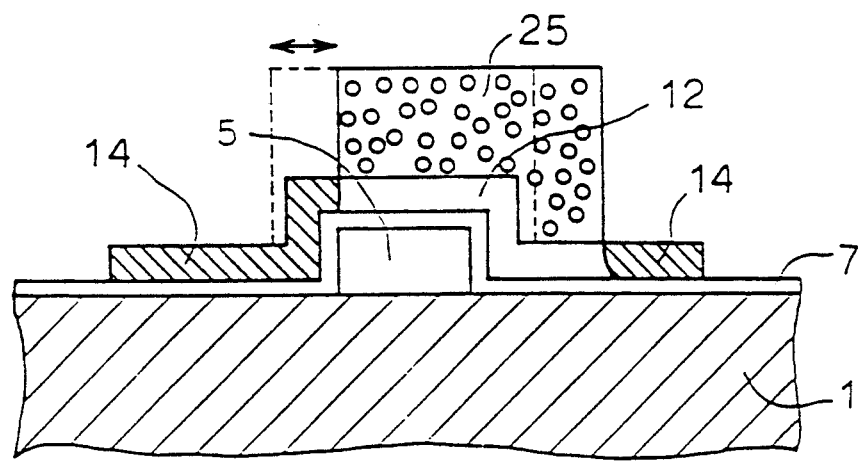
FIG. 13 is a sectional view which shows a state when an alignment error occurs in the manufacturing steps shown in FIG. 10.
Figure 14:
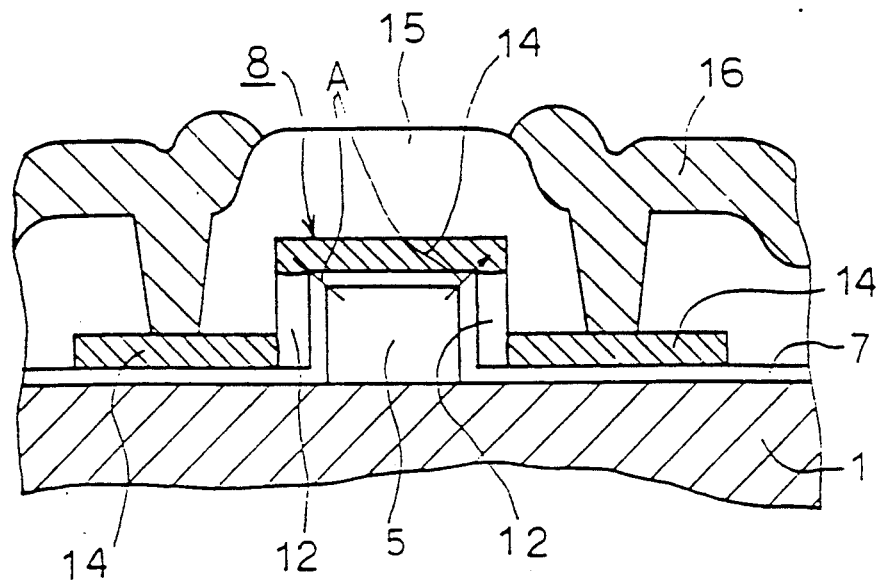
FIG. 14 is a sectional structural view of a thin film transistor according to a second conventional example.
Figure 15:
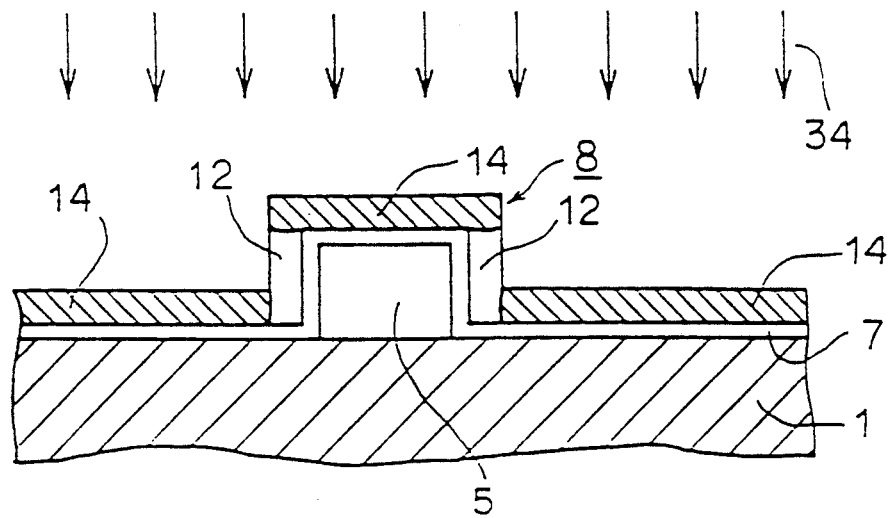
FIG. 15 is a sectional structural view showing the main manufacturing step of thin film transistor shown in FIG. 14.
Figure 16A:
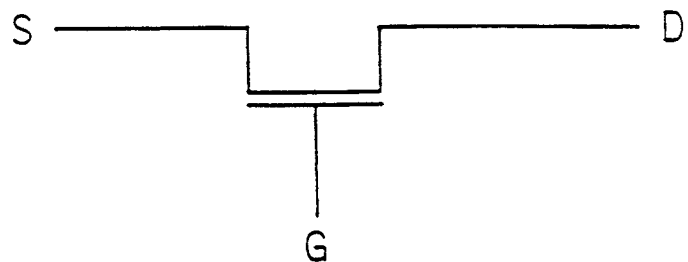
FIG. 16 is an equivalent circuit diagram of a thin film transistor, wherein (a) is an equivalent circuit diagram of the thin film transistor shown in FIG. 7, and (b) is an equivalent circuit diagram of the thin film transistor shown in FIG. 14.
Figure 16B:
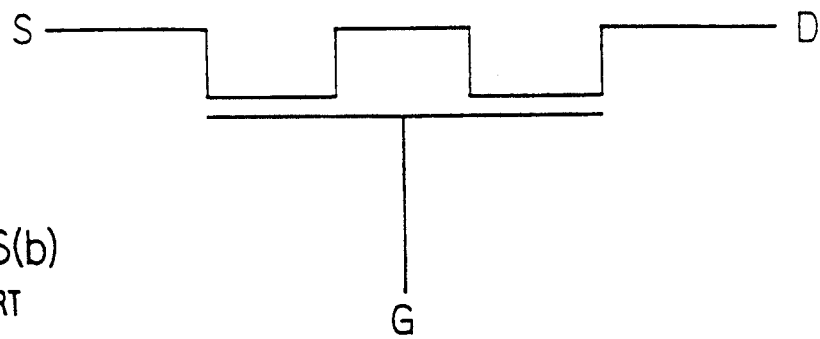

Referring to FIG. 6, interlayer insulating film 15 is formed on the whole surface and contact holes are opened in prescribed positions. A conductive layer is formed within the contact holes and the surface of interlayer insulating layer 15 and then patterned to a prescribed shape. As a result, interconnection layers 16, 16 are formed. By following the above steps, wafer process of thin film transistor is finished.

Although in the above embodiment, an n channel MOS type thin film transistor is described, the structure of the present invention can be similarly applied to a p channel MOS type thin film transistor.

As described above, according to the present invention, source/drain regions are formed to have an LDD structure, so that electric field can be reduced, in particular, in the vicinity of the drain and also the generation of leakage current can be suppressed.

Also, in the above embodiment, sidewall insulating layers are formed on side surfaces of steps of a semiconductor layer and source/drain regions of an LDD structure are formed in a self alignment manner using the sidewall insulating layer as masks by oblique rotation ion implantation and vertical ion implantation, so that mask process can be omitted and therefore a thin film transistor of an LDD structure can be manufactured in simpler manufacturing steps.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film field effect element, comprising:
   a gate electrode formed on a surface of an insulating base layer
   a gate insulating layer formed on said surface of the insulating base layer and surfaces of said gate electrode;
   a semiconductor layer formed on surfaces of said gate insulating layer;
   a channel region formed in said semiconductor layer on a side surface of said gate electrode;
   impurity regions of low concentration formed in said semiconductor layer adjacent to said channel region; and
   impurity regions of high concentration formed in said semiconductor layer adjacent to said impurity regions of low concentration.

2. The thin film field effect element according to claims 1, further comprising a sidewall insulating layer adjacent a vertical side surface of said semiconductor layer;
   one of said impurity regions of low concentration being located under said sidewall insulating layer.

3. The thin film field effect element according to claim 1, wherein an upper insulating layer is formed between an upper surface of said gate electrode and said gate insulating layer.

4. The thin film field effect element according to claim 2, wherein an upper insulating layer is formed between an upper surface of said gate electrode and said gate insulating layer.

5. A thin film field effect element, comprising:
   a gate electrode formed on an insulating base layer, and having a pair of first and second side surfaces facing to each other and an upper surface;
   an upper insulating layer formed on said upper surface of the gate electrode;
   a gate insulating layer formed on surfaces of said gate electrode and said upper insulating layer;
   a semiconductor layer formed on surfaces of said gate insulating layer and said base layer;

first and second channel regions formed in said semiconductor layer facing to said first and said second side surfaces, respectively, of said gate electrode; and first and second source/drain regions formed in portions of said semiconductor layer located on said base layer and a third source/drain region formed in a portion of said semi-conductor layer located on said upper insulating layer; wherein each of said first, second and third source/drain regions includes impurity regions of high concentration and impurity regions of low concentration adjacent to at least one of said first and said second channel region.

* * * * *